United States Patent
Wu

(10) Patent No.: US 9,264,068 B2
(45) Date of Patent: Feb. 16, 2016

(54) DEFLATE COMPRESSION ALGORITHM

(71) Applicant: Tidal Systems, Inc., Santa Clara, CA (US)

(72) Inventor: Yingquan Wu, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/274,364

(22) Filed: May 9, 2014

(65) Prior Publication Data

US 2015/0326248 A1 Nov. 12, 2015

(51) Int. Cl.
*H03M 7/40* (2006.01)
*H03M 7/30* (2006.01)

(52) U.S. Cl.
CPC .............. *H03M 7/3095* (2013.01); *H03M 7/40* (2013.01)

(58) Field of Classification Search
CPC ........ H03M 7/40; H03M 7/30; H03M 7/3095
USPC ..................... 341/64, 50, 51, 67, 87
See application file for complete search history.

(56) References Cited

U.S. PATENT DOCUMENTS

| | | | | |
|---|---|---|---|---|
| 6,253,264 | B1* | 6/2001 | Sebastian | 710/68 |
| 6,411,227 | B1* | 6/2002 | Fish | 341/65 |
| 6,411,229 | B2* | 6/2002 | Kobayashi | 341/67 |
| 7,307,552 | B2* | 12/2007 | Ma et al. | 341/51 |
| 2002/0063641 | A1* | 5/2002 | Fish | 341/87 |
| 2003/0210825 | A1* | 11/2003 | Friederich et al. | 382/246 |
| 2004/0001543 | A1* | 1/2004 | Adams et al. | 375/240 |
| 2013/0162453 | A1* | 6/2013 | Jaquette | 341/67 |

* cited by examiner

*Primary Examiner* — Jean B Jeanglaude
(74) *Attorney, Agent, or Firm* — Brooks, Cameron & Huebsch, PLLC

(57) ABSTRACT

A compression algorithm replaces duplicative strings with a copy pair indicating a location and length of a preceding identical string that is within a window from the duplicative string. Rather than a replacing a longest matching string within a window from a given point with a copy pair, the longest matching string may be used provide it is at least two bytes larger than the next longest matching string or is at a distance that is less than some multiple of a distance to the next longest matching string. In another aspect, the length of the window in which a matching string may be found is dependent on a length of the matching string. In yet another aspect, rather than labeling each literal and copy pair to indicate what it is, strings of non-duplicative literals are represented by a label and a length of the string.

21 Claims, 5 Drawing Sheets

DEFLATE COMPRESSION ALGORITHM

BACKGROUND

1. Field of the Invention

This invention relates to systems and methods for lossless compression of data.

2. Background of the Invention

Modern lossless data compression is a class of data compression algorithms that allow the original data to be perfectly reconstructed from the compressed data. By contrast, lossy data compression permits reconstruction only of an approximation of the original data, while this usually allows for improved compression rates.

DEFLATE is a lossless data compression algorithm that uses a combination of the LZ77 algorithm and Huffman coding. It was originally defined by Phil Katz for version 2 of his PKZIP archiving tool and was later specified in standard RFC 1951. DEFLATE has widespread uses, for example in GZIP compressed files, PNG (Portable Network Graphic) image files and the ZIP file format for which Katz originally designed it.

LZ77 compression works by finding sequences of data that are repeated. The term "sliding window" is used; all it really means is that at any given point in the data, there is a record of what characters went before. A 32K sliding window means that the compressor (and decompressor) have a record of what the last 32768 (32*1024) characters were. When the next sequence of characters to be compressed is identical to one that can be found within the sliding window, the sequence of characters is replaced by two numbers: a distance, representing how far back into the window the sequence starts, and a length, representing the number of characters for which the sequence is identical.

The compressor uses a chained hash table to find duplicated strings, using a hash function that operates on typically 2 or 3-byte sequences. At any given point during compression, let XYZ be the next 3 input bytes to be examined (not necessarily all different, of course). First, the compressor examines the hash chain for XYZ. If the chain is empty, the compressor simply writes out X as a literal byte and advances one byte in the input. If the hash chain is not empty, indicating that the sequence XYZ (or, if we are unlucky, some other 3 bytes with the same hash function value) has occurred recently, the compressor compares all strings on the XYZ hash chain with the actual input data sequence starting at the current point, and selects the longest match.

The compressor searches the hash chains starting with the most recent strings, to favor small distances and thus take advantage of the Huffman encoding. The hash chains are singly linked. There are no deletions from the hash chains; the algorithm simply discards matches that are too old. To avoid the worst-case situation, very long hash chains are arbitrarily truncated at a certain length, determined by a run-time parameter.

To improve overall compression, the compressor optionally defers the selection of matches ("lazy matching"): after a match of length N has been found, the compressor searches for a longer match starting at the next input byte. If it finds a longer match, it truncates the previous match to a length of one (thus producing a single literal byte) and then emits the longer match. Otherwise, it emits the original match, and, as described above, advances N bytes before continuing.

Lempel-Ziv-Storer-Szymanski (LZSS) was created in 1982 by James Storer and Thomas Szymanski. The LZSS decompressor has the form:

For each copy item, fetch a "literal/copy" bit from the compressed file.

0: literal: the decoder grabs the next byte from the compressed file and passes it straight through to the decompressed text.

1: copy item: the decoder grabs the next 2 bytes from the compressed file, breaks it into a 4 bit "length" and a 12 bit "distance". The 4 "length" bits are decoded into a length from 3 to 18 characters. Then find the text that starts that "distance" back from the current end of decoded text, and copy "length" characters from that previously-decoded text to end of the decoded text.

Repeat from the beginning until there is no more items in the compressed file.

A Huffman code is a prefix code prepared by a special algorithm. Each code is a series of bits, either 0 or 1, representing an element in a specific "alphabet" (such as the set of ASCII characters, which is the primary but not the only use of Huffman coding in DEFLATE).

A Huffman algorithm starts by assembling the elements of the "alphabet," each one being assigned a "weight"—a number that represents its relative frequency within the data to be compressed. These weights may be guessed at beforehand, or they may be measured exactly from passes through the data, or some combination of the two. In any case, the elements are selected two at a time, the elements with the lowest weights being chosen. The two elements are made to be leaf nodes of a node with two branches.

When all nodes have been recombined into a single "Huffman tree," then by starting at the root and selecting 0 or 1 at each step, you can reach any element in the tree. Each element now has a Huffman code, which is the sequence of 0's and 1's that represents that path through the tree.

Now, it should be fairly easy to see how such a tree, and such a set of codes, could be used for compression. If compressing ordinary text, for example, probably more than half of the ASCII character set could be left out of the tree altogether. Frequently used characters, like 'E' and 'T' and 'A,' will probably get much shorter codes, and even if some codes are actually made longer, they will be the ones that are used less often.

However, there is also the question: how do you pass the tree along with the encoded data? It turns out that there is a fairly simple way, if you modify slightly the algorithm used to generate the tree.

In the classic Huffman algorithm, a single set of elements and weights could generate multiple trees. In the variation used by the Deflate standard, there are two additional rules: elements that have shorter codes are placed to the left of those with longer codes. (In our previous example, D and E wind up with the longest codes, and so they would be all the way to the right.) Among elements with codes of the same length, those that come first in the element set are placed to the left. (If D and E end up being the only elements with codes of that length, then D will get the 0 branch and E the 1 branch, as D comes before E.) It turns out that when these two restrictions are placed upon the trees, there is at most one possible tree for every set of elements and their respective code lengths. The code lengths are all that we need to reconstruct the tree, and therefore all that we need to transmit.

The methods disclosed herein provide an improved approach for compressing data using the DEFLATE algorithm.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
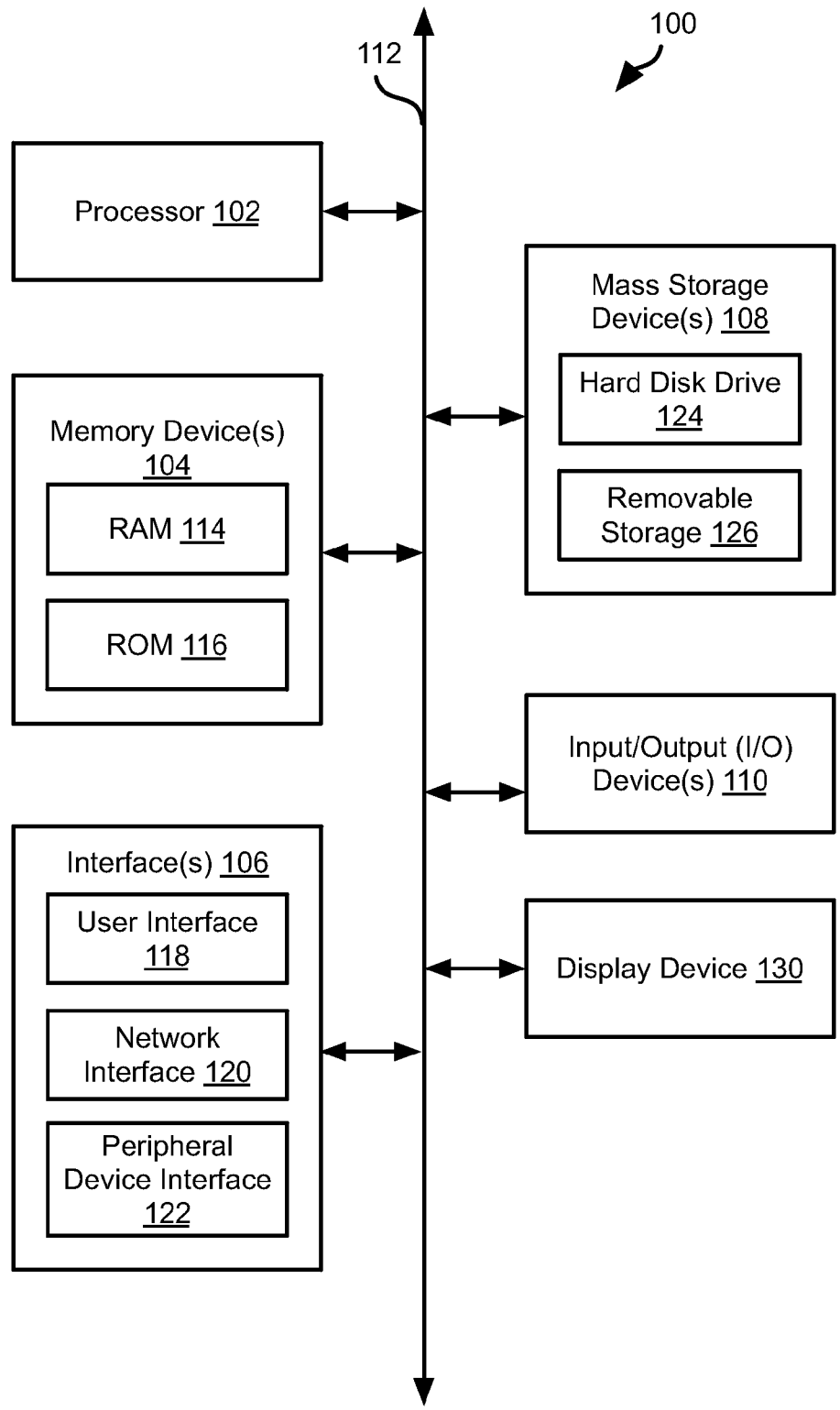
FIG. 1 is a schematic block diagram of a computer system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods for performing the DEFLATE algorithm to achieve greater compression. In a first aspect, for a given point in the file, the length of a following string found to match a preceding string is selected based on a distance to the preceding string. In particular, the length of the following string must either a) be larger than a threshold amount than the next longest matching string or have a size at least as greater as the threshold amount or the distance to the matching string must be less than some multiple of the distance to the next longest matching string.

In another aspect, the window in which a matching string will be used to generate a copy pair is dependent on the length of the string, i.e. the longer the matching string, the larger the window in which it may be found.

In yet another aspect, for a first portion of the file, rather than labeling each literal byte, a label (e.g. 0 bit) is used with an N bit (e.g. 3) length indicator, the value of the N bit length indicator indicating a number of up to $2^N$ literals in a string represented by the label. At a point in the file at which the number of non-duplicative strings of non-duplicative greater than $2^N$ is less than the number of non-duplicative strings of length less than $2^N$.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized, including non-transitory media. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device can perform various monitoring functions as discussed herein, and can execute one or more application programs, such as the application programs described herein. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer readable media, such as magnetic tapes, magnetic disks, optical disks, solid-state memory (e.g., Flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
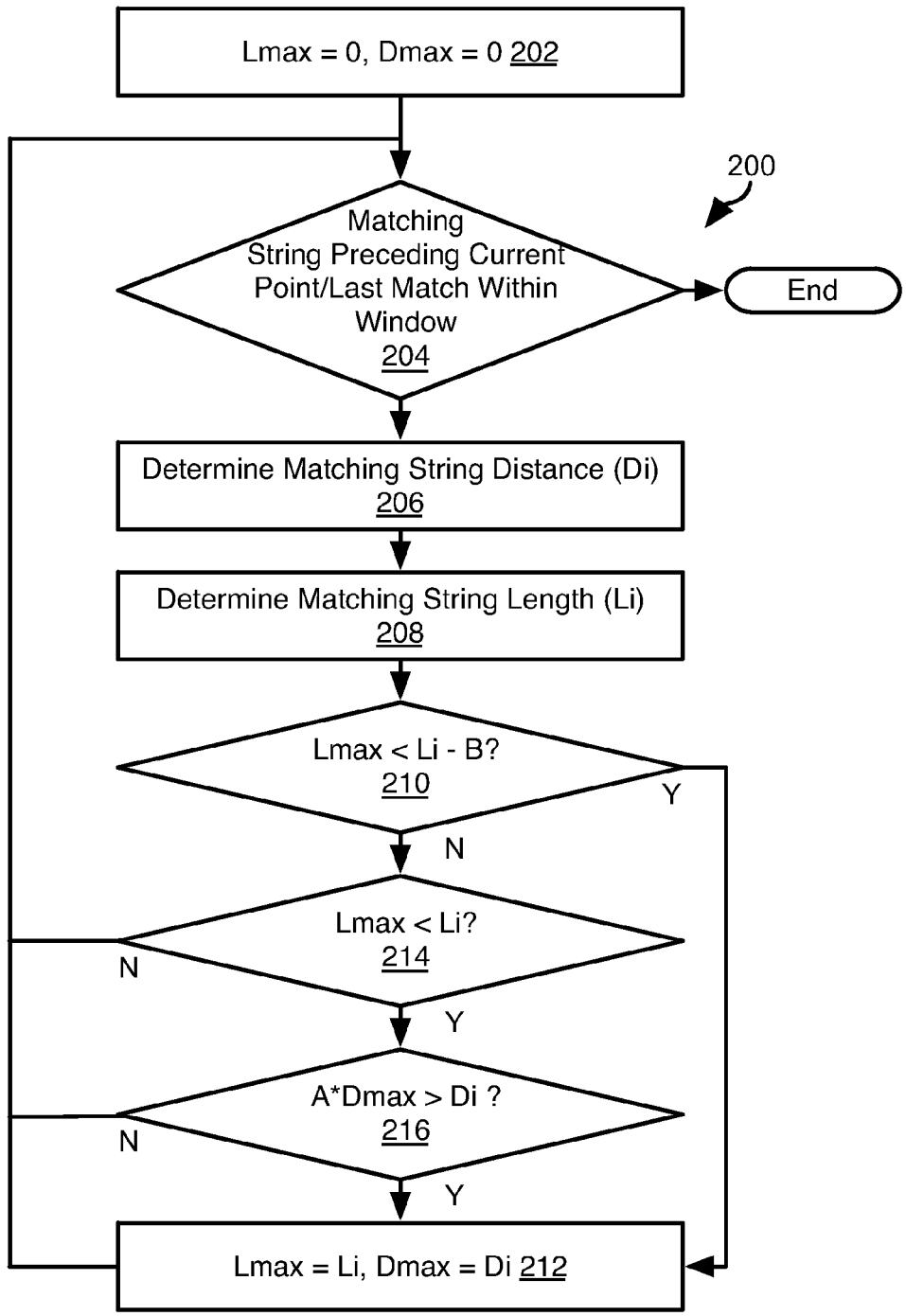
FIG. 2 is a process flow diagram of a method for selecting a matching string for replacement in accordance with an embodiment of the present invention.

Referring to FIG. 2, in the matching mechanism of the existing DEFLATE algorithm, the longest match of string is selected for de-duplication. Note the matching is carried out in the sequential order of increasing distance, therefore, for the same matching length, the one corresponding to the shortest distance is always chosen. However, a longer distance is typically represented by more (partially Huffman encoded) bits. To this end, we incorporate the distance factor into the match according to the method 200 of FIG. 2. For example, the method 200 may be executed at a current point in the file such that candidate literal strings beginning at that point may be evaluated with respect to strings preceding that point to determine a longest candidate string that has a preceding matching string meeting the conditions imposed according to the method 200. The method 200 may include initializing 202 a longest matching string length ($L_{max}$) and a distance to the start of the longest matching string length ($D_{max}$) to zero. The method may then include determining 204 whether there is a preceding string matching a string starting at the current point. If not, the method 200 may end. If so, then the distance ($D_i$) to the start of that string and the length ($L_i$) of the matching string may be determined 206, 208.

If $L_i$–B is found 210 to be larger than the current value of $L_{max}$, then at step 212 $L_{max}$ is set to $L_i$ and $D_{max}$ is set to $D_i$. If not, the method may include determining 214 if $L_{max}$ is less than $L_i$ and determining 216 if $(A*D_{max})>D_i$, where A and B are parameters chosen to reduce the size of Huffman encoded representation of the Length/Distance pair that will be used to represent the matching string in the DEFLATE algorithm. If both conditions are met, then step 212 is executed to set $L_{max}$ equal to $L_i$ and $D_{max}$ equal to $D_i$. If none, or only one, of the conditions of steps 212, 214 are found to be true, then the value of $L_{max}$ and $D_{max}$ are not set equal to $L_i$ and $D_i$. The method may then return to step 204 at which point the method 200 may include determining if there is a longer matching string preceding the matching string analyzed in the preceding iteration and that is within a matching window preceding the current point.

The method of FIG. 2 may be represented by (1).

If $(L_{max}<L_i-B$ or $(L_i-B \leq L_{max}<L_i$ and $AD_{max}>D_i))$, then set $(L_{max},D_{max}) \leftarrow (L_i,D_i)$     (1)

The method 200 and (1) impose a limitation that a string will not be selected as the longest matching string unless it is at least (B+1) bytes (where $L_{max}$ and $L_i$ are measured in bytes) longer than the previously determined $L_{max}$ (or at least greater than B+1, where no other matching string has been found) unless the distance $D_i$ for that matching string is smaller than A times the distance $D_{max}$ of the previously found longest matching string. In experiments conducted by the inventor values of B=1 and A=4 were found to provide good improvement in compression in subsequent Huffman coding. However, B=2, 3, or some other integer and A=2, 3, 5, or some other integer may also be used.

The method of FIG. 2 and (1) may advantageously ensure that the length of the Length/Distance pair replacing the matching string will have, or be more likely to have, a smaller Huffman coded length than the encoded length of the Length/Distance pair replacing the next shortest matching string plus the Huffman coded length of the literals included in the longest matching string but not the next-longest matching string.

Figure 3:
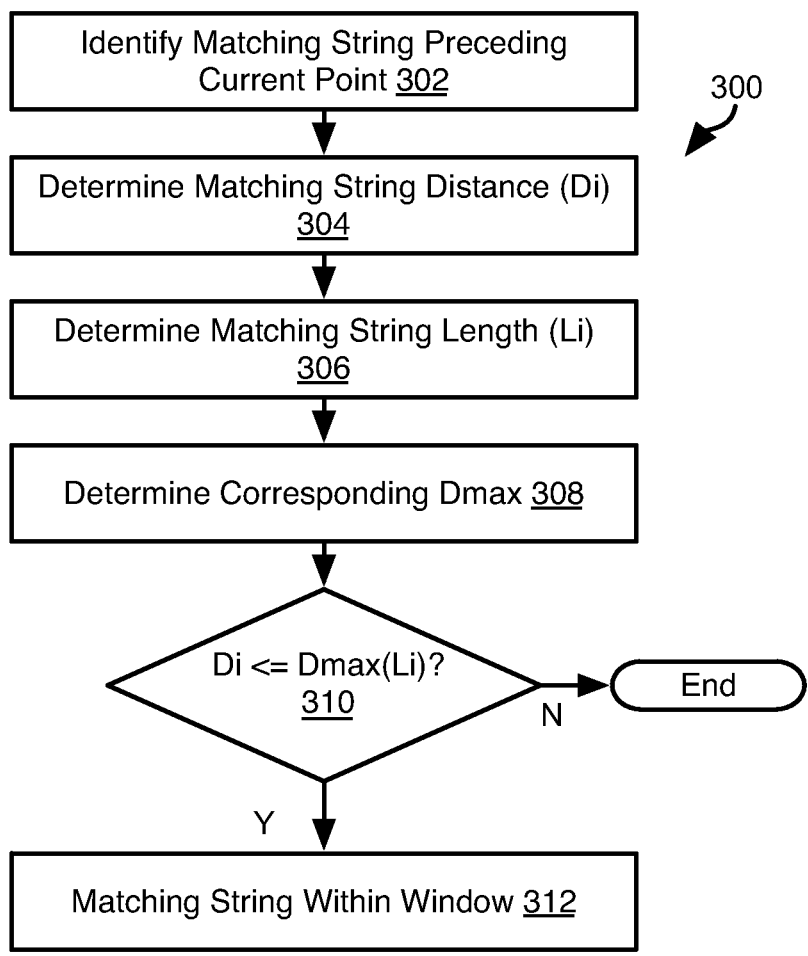
FIG. 3 is a process flow diagram of a method for determining a length dependent window in accordance with an embodiment of the present invention.

Referring to FIG. 3, in existing DEFLATE algorithms all matching lengths share the same sliding window, i.e., maximum distance. Under this setup, the matching length of two is nearly useless, if not worse. This is because, under, for example, LZSS (Lempel-Ziv-Storer-Szymansk), the uncompressed two literals requires 18 bits (comprised with 2 bits of indictors and 2 bytes of literals), whereas the copy pair (L=2, D) may well employ more than 18 bits (Note D is represented by 15 bits in gzip). In fact, the prevalent gzip specification does not consider the matching of two literals. Observations made by the inventors have shown that in DEFLATE specification, a matching length is always followed by the corresponding matching distance. Therefore, it is theoretically feasible to have different matching windows for each match length. To this end, we propose the empirical choices of sliding windows listed in (2).

$$\begin{cases} D \leq 2^4, & \text{if } L = 2 \\ D \leq 2^8, & \text{if } L = 3 \\ D \leq 2^{12}, & \text{if } L = 4 \\ D \leq 2^{15}, & \text{if } L \geq 5 \end{cases} \quad (2)$$

As a consequence, Huffman encoding should be applied separately to each of the above four distance sets.

In view of the foregoing a method 300 may be implemented in the context of performing compression according to the DEFLATE algorithm. For example, the method 300 may be executed with respect to each string following a current point in a file for which a matching string is found preceding that point. The method 300 may be executed as part of step 202 of the method 200 in which a matching string is evaluated to determine whether it is within a window preceding a current point.

The method 300 may include identifying 302 a matching string preceding the current point 302, which may include identifying a matching string preceding a preceding matching string. The method 300 may further include determining 304 a distance ($D_i$) to the matching string from the current point and determining 306 a length ($L_i$) of the matching string, which may both be measured in bytes or some other unit. The value of $D_{max}$ corresponding to $L_i$ may then be determined, 308 such as consulting a table as shown by (2) or evaluating a function $D_{max}=f(L_i)$. If $D_i$ is found 310 to be less than or equal to $D_{max}$ as determined at step 308, then the matching string may be determined 312 to be within an acceptable window preceding the current point. Otherwise, the matching string will be found to not be within an acceptable matching window and the method 300 may end.

Figure 4:
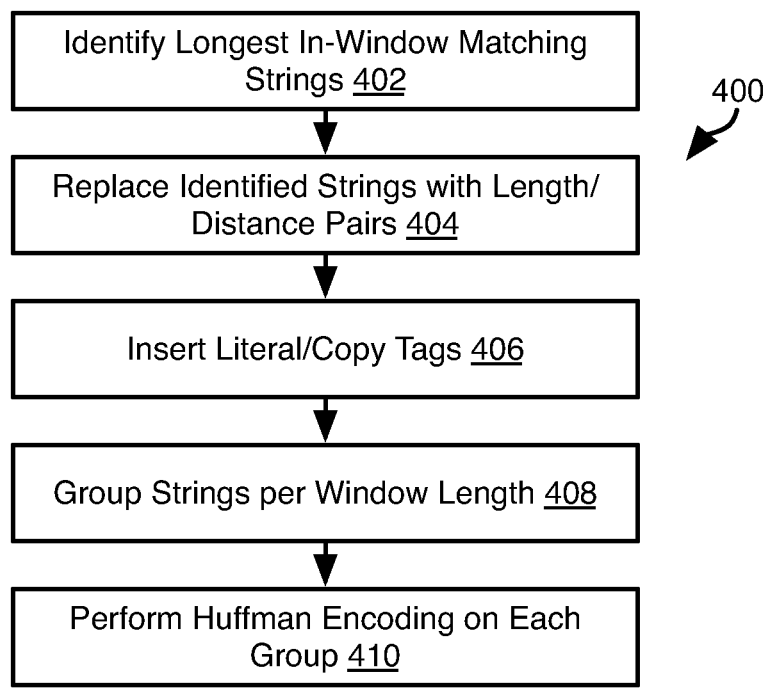
FIG. 4 is a process flow diagram of a method for compressing a file in accordance with an embodiment of the present invention.

Referring to FIG. 4, compression of a file may be accomplished according to the method 400. The method 400 may include identifying the longest in-window strings. The window in which a matching string must be found may be determined according to the method 300 of FIG. 3. Likewise, the "longest" matching string, may be the longest string found according to the method 200 of FIG. 2 even though a longer matching string may be within an acceptable window but be rejected as failing to meet the conditions imposed by the method 200. The matching strings identified 402 may be replaced 404 with a copy pair (Length/Distance) indicating the length of the matching string and the distance to the matching string in the file. Each copy pair and literal may then be labeled by inserting 406 a tag in front of each one. As noted in the background section, this may include inserting 1 if the following two bytes are a Length/Distance pair or a 0 if the following byte is a literal.

The method may further include grouping 408 copy pairs according to the window used to select them. That is, the value of $D_{max}$ used according to the method 300 to determine whether a matching string was within a matching window may be used to group copy pairs. Thus, all copy pairs for strings of a length, or range of lengths, corresponding to a same window size $D_{max}$ will be grouped together. The data file may then be Huffman encoded 410 with each group being Huffman coded separately.

Figure 5:
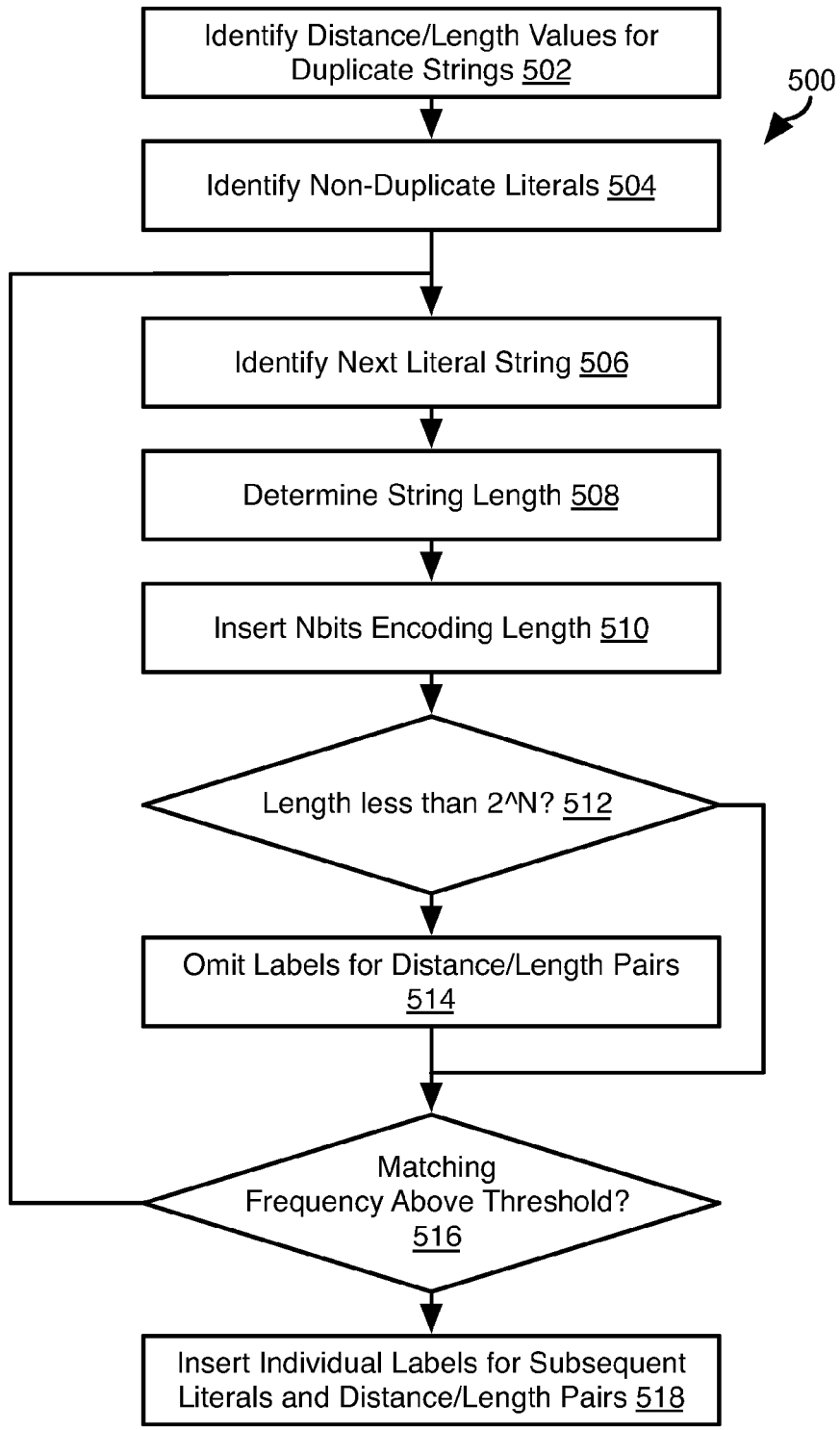
FIG. 5 is a process flow diagram of a method for labeling literals and copy pairs in accordance with an embodiment of the present invention.

Referring to FIG. 5, in some embodiments, inserting 406 literal/copy tags may be performed according to the illustrated method 500. When LZSS is employed, a long string of literals take proportional number of indicator bits. Particularly during start of raw text, matching is infrequent. In this scenario, we may alternatively use an indicator bit 0 followed by the number of literals to indicate a long string of literals. For instance, by using three bits to represent up to 8 literals (or N bits to represent $2^N$ literals), we need 4 bits of indicator for a string of up to 8 literals or N+1 bits of indicator for a string of $2^N$ literals. If most strings are close to 8 literals (or $2^N$ literals for a more general case), we save nearly half number of indicator bits. Moreover, when the length of literal string is less than 8 (or $2^N$ literals for a more general case), the following term must be a copy pair, therefore, the corresponding indicator bit 1 can be removed without ambiguity. However, after beginning of data, the matching becomes more and more frequent, and unmatched literals become more and more scattered, it is not worth encoding indicator bits in this manner. To this end, the above indicator encoding may be used until the number of strings of length 8 (or $2^N$ literals for a more general case) falls below the average number of strings of a length up to 8 (or $2^N$ literals for a more general case). This termination point is necessarily sent along with the compressed data, such as in a header or metadata associated with a compressed file.

This approach may be understood with respect to the illustrated method 500. The method 500 may include identifying 502 copy pairs, i.e. Distance/Length values for duplicate strings as for other methods described herein. Non-duplicate literals may also be identified 504. Literal strings may be processed starting at the beginning of the file according to steps 506-516. In particular, a string of consecutive literals maybe identified 506 and the length determined 508. N bits (e.g. 3 for N=3) may be inserted 510 before the string of literals, the N bits having a value encoding or being equal to the length of the string of literals.

The method may further include evaluating 512 if the length of the string of literals is less than $2^N$ (e.g. 8 if N=3). If so, then the label (e.g. 1) for the following copy pair (Length/Distance) may be omitted 514 since there is no possibility that the following byte is a literal, since this can only occur if the number of consecutive literals is greater than $2^N$.

The method may include evaluating 516 after processing of each literal string, or after evaluating some minimum number of literal strings if the frequency of strings larger than 8 meets some threshold condition. For example, as noted above, the threshold condition may include evaluating whether the number of strings exceeding 8 literals (or $2^N$ literals for the general case) is greater than the number of literal strings less than 8 literals (or $2^N$ literals for the general case). For purpose of measuring frequency a sliding window may be used that includes the current point and portions of the data file before and/or after the current point. The frequency of occurrence of $2^N$ length literals and shorter literals may be evaluated within that window. The length of the window may be measured as a number of literals before and/or after the current point or a number of literal strings before and/or after the current point. If so, then the next literal string may be processed according to steps 506-516. If not, then all subsequent literal bytes and copy pairs may be individually labeled by inserting 518 a 0 or 1 before each literal byte or copy pair. As noted above, the point in the file at which labeling returns to individual labeling of literals may be noted in a file header or other metadata associated with a compressed file.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What are claimed are listed below:

1. An apparatus for compression comprising one or more processors and one or more memory devices operably coupled to the one or more processors, the one or more memory devices storing executable code effective to cause the one or more processors to:
   provide a distance multiple A and a minimum length parameter B, both being integers;
   evaluate a plurality of bytes in a data file to identify duplicative strings by, at each point of a plurality of points in the data file:
   identifying a longest candidate string starting at the each point for which a preceding matching string in the file is identical to the longest candidate string and for which at least one of (a) the preceding matching string has at least one of a length meeting a length threshold defined by B and an length difference with respect to a next longest matching string meeting a length difference threshold defined by B, the next-longest matching string preceding the each point and matching a portion of the longest candidate string beginning at the each point and (b) the preceding matching string begins at a distance $D_i$ from the each point that is less than A times a distance $D_{max}$ to a beginning of the next-longest matching string; and
   replacing the longest candidate string with a copy pair including the distance $D_i$ and a length of the candidate string.

2. The apparatus of claim 1, wherein the executable code is further effective to cause the one or more processors to include the preceding matching string in the output file, the preceding matching string being labeled with a first label and the copy pair being labeled with a second label different from the first label.

3. The apparatus of claim 1, wherein the executable code is further effective to cause the one or more processors to Huffman code the output file.

4. The apparatus of claim 1, wherein the executable code is further effective to cause the one or more processors to identify the longest candidate string as the longest candidate string for which $D_i$ is less than a window size.

5. The apparatus of claim 1, wherein the executable code is further effective to cause the one or more processors to identify the longest candidate string as the longest candidate string for which $D_i$ is less than a window size, the window size being a function of the length of the longest candidate string.

6. The apparatus of claim 5, wherein the executable code is further effective to cause the one or more processors to separately encode groups of copy pairs, the copy pairs of each group having a same length value.

7. The apparatus of claim 1, wherein A is equal to four.

8. The apparatus of claim 1, wherein:
   B is equal to 1;
   the length threshold is a minimum length of B+1; and
   the difference threshold is a difference in length of at least B+1.

9. An apparatus for compression comprising one or more processors and one or more memory devices operably coupled to the one or more processors, the one or more memory devices storing executable code effective to cause the one or more processors to:
   identify, among a plurality of literals of a data file, duplicative strings $S_i$, i=1 to P, P being a number of the duplicative strings, each duplicative string $S_i$ having a length $L_i$ and being identical to a preceding string located before the duplicative string located a distance $D_i$ before the each duplicative string $S_i$;
   identify, among the plurality of bytes of the data file, literal strings $L_j$, j=1 to M, M being a number of the literal strings, each literal string being a string of contiguous literals in the data file, each literal string $L_j$ not being preceded by an identical string in the data file that meets at least one of a length and a distance criteria with respect to the literal string;
   generate a first portion of the output file wherein:
   before each literal string $L_j$ of a first portion of the literal strings $L_j$ located in an initial portion of the data file are inserted a literal label and N bits encoding a length of the literal string; and
   each duplicative string $S_i$ is replaced by a copy pair indicating a length of the duplicative string and the distance $D_i$ corresponding thereto; and
   generate a second portion of the output file wherein:
   a literal label is inserted before each literal of each literal string $L_j$; and
   each duplicative string $S_i$ is replaced by a copy label and a copy pair indicating a length of the duplicative string and the distance $D_i$ corresponding thereto.

10. The apparatus of claim 9, wherein the executable code is further effective to cause the one or more processors to generate the first portion of the output file wherein each duplicative string $S_i$ is replaced by the copy pair by:
    inserting a copy label in the output file before each copy pair that follows a literal $L_j$ of length $2^N$; and
    not inserting a copy label in the output file before each copy pair that follows a literal string $L_j$ of length less than $2^N$.

11. The apparatus of claim 9, wherein a second portion of the file has a lower frequency of literal strings $L_j$ of length greater than $2^N$ than the first portion.

12. The apparatus of claim 11, wherein the second portion of the file has a higher frequency of occurrence of literal strings L of length less than $2^N$ than a frequency of occurrence of literal strings $L_j$ of length greater than $2^N$.

13. The apparatus of claim 12, wherein N is equal to three.

14. An apparatus for compression comprising one or more processors and one or more memory devices operably coupled to the one or more processors, the one or more memory devices storing executable code effective to cause the one or more processors to:

sequentially evaluate a plurality of bytes in a data file to identify duplicative strings by, at each point of a plurality of points in the data file:
  identifying a longest candidate string having a length and starting at the each point for which a matching preceding string is found before the each point and within a maximum distance corresponding to the length; and
  replacing the longest candidate string with a copy pair including the distance $D_i$ and a length of the longest candidate string.

15. The apparatus of claim 14, wherein identifying the longest candidate string further comprises:
  evaluating a distance function with respect to the length to obtain the maximum distance.

16. The apparatus of claim 14, wherein the executable code is further effective to cause the one or more processors to identify the longest candidate string by:
  looking up an entry in a look-up table for the length; and
  retrieving the maximum length from the look-up table.

17. The apparatus of claim 14, wherein the executable code is further effective to cause the one or more processors to identify the longest candidate string by:
  determining that the longest candidate string is starts at the each point and a preceding matching string in the file is identical to the longest candidate string and that at least one of (a) the preceding matching string is at least one of 2 bytes long and 2 bytes longer than a next-longest matching string preceding the each point and matching a portion of the longest candidate string beginning at the each point and (b) the preceding matching string begins at a distance $D_i$ from the each point that is less than 4 times a distance $D_{max}$ to a beginning of the next-longest matching string.

18. The apparatus of claim 14, wherein the executable code is further effective to cause the one or more processors to:
  identify, among the plurality of bytes of the data file, literal strings $L_j$, j=1 to M, M being a number of the literal strings, each literal string being a string of contiguous literals in the data file, each literal string $L_j$ not being preceded by an identical string in the data file that meets at least one of a length and a distance criteria with respect to the literal string;
  generate a first portion of the output file wherein:
    before each literal string $L_i$ of a first portion of the literal strings $L_i$ located in an initial portion of the data file are inserted a literal label and N bits encoding a length of the literal string; and
  generate a second portion of the output file wherein:
    a literal label is inserted before each literal of each literal string $L_i$; and
    a copy label is inserted before each copy pair.

19. The apparatus of claim 18, wherein the executable code is further effective to cause the one or more processors to generate a first portion of the output file by:
  inserting a copy label in the output file before each copy pair that follows a literal Li of length $2^N$; and
  not inserting a copy label in the output file before each copy pair that follows a literal string Li of length less than $2^N$.

20. The apparatus of claim 18, wherein a second portion of the file has a lower frequency of literal strings Li of length greater than $2^N$ than the first portion.

21. The apparatus of claim 20, wherein the second portion of the file has a higher frequency of occurrence of literal strings $L_i$ of length less than $2^N$ than a frequency of occurrence of literal strings $L_i$ of length greater than $2^N$.

* * * * *